United States Patent
Wu et al.

(10) Patent No.: US 9,109,604 B2
(45) Date of Patent: Aug. 18, 2015

(54) FAN CONTROL CIRCUIT

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Kang Wu, Shenzhen (CN); Bo Tian, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 431 days.

(21) Appl. No.: 13/707,678

(22) Filed: Dec. 7, 2012

(65) Prior Publication Data
US 2014/0134000 A1    May 15, 2014

(30) Foreign Application Priority Data
Nov. 14, 2012    (CN) .......................... 2012 1 0456243

(51) Int. Cl.
| | |
|---|---|
| G05D 23/00 | (2006.01) |
| F04D 27/00 | (2006.01) |
| H05K 7/20 | (2006.01) |
| G06F 1/20 | (2006.01) |

(52) U.S. Cl.
CPC .............. *F04D 27/00* (2013.01); *G06F 1/206* (2013.01); *H05K 7/20836* (2013.01); *Y02B 60/1275* (2013.01)

(58) Field of Classification Search
CPC ................................ G05D 23/19; G05D 7/06
USPC .............. 318/471, 472, 400.01, 400.14, 432, 318/799, 800; 361/679.48, 676, 695; 454/15, 140; 310/40.5; 374/145; 700/300
See application file for complete search history.

(56) References Cited

U.S. PATENT DOCUMENTS 7,990,087 B2 *    8/2011    Artman et al. ........... 318/400.07

* cited by examiner

*Primary Examiner* — Antony M Paul
(74) *Attorney, Agent, or Firm* — Novak Druce Connolly Bove + Quigg LLP

(57) ABSTRACT

A control circuit controls a fan to cool an integrated baseboard management controller (iBMC) in a server. The control circuit includes a state determination module. When the server is powered off and the iBMC is operating, the state determination module receives low level signals from a power supply unit (PSU) and the iBMC. The state determination module connects the PSU and the fan, such that the fan is operating. When the server and the iBMC are powered off, the state determination module receives a low level signal from the PSU and a high level signal from the iBMC. The state determination module disconnects the PSU from the fan, turning the fan off. When the server is operating, the state determination module receives a high level signal from the PSU. The state determination module disconnects the PSU from the fan, turning the fan off.

8 Claims, 4 Drawing Sheets

FAN CONTROL CIRCUIT

BACKGROUND

1. Technical Field

The present disclosure relates to a circuit for controlling a fan.

2. Description of Related Art

In current servers, integrated baseboard management controllers (iBMCs) are usually used. However, there are no special fans to cool the iBMCs. This may result in overheating of the iBMCs.

BRIEF DESCRIPTION OF THE DRAWINGS

Many aspects of the embodiments can be better understood with reference to the following drawing. The components in the drawings are not necessarily drawn to scale, the emphasis instead being placed upon clearly illustrating the principles of the present embodiments. Moreover, in the drawings, like reference numerals designate corresponding parts throughout the view.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
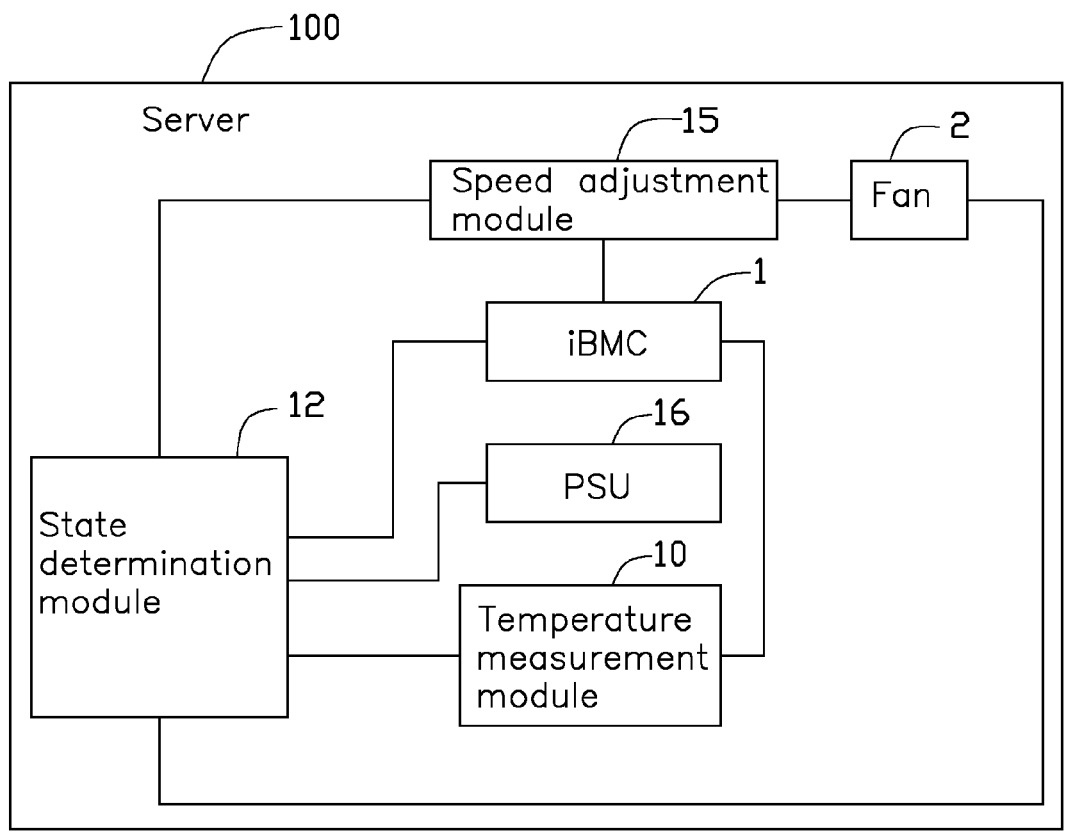
FIG. 1 is a block diagram of an exemplary embodiment of a control circuit for a fan.

FIG. 1 shows an embodiment of a control circuit. The control circuit is to control a fan 2 for cooling an integrated baseboard management controller (iBMC) 1 in a server 100. The control circuit includes a temperature measurement module 10, a state determination module 12, and a speed adjustment module 15.

The state determination module 12 is connected to the iBMC 1 and a power supply unit (PSU) 16, to determine states of the iBMC 1 and the PSU 16, and outputs corresponding determination signals. The state determination module 12 further supplies power to the fan 2 or does not supply power to the fan 2 according to the determination result. The state determination module 12 is further connected to the temperature measurement module 10 and the speed adjustment module 15. The state determination module 12 further supplies power to the temperature measurement module 10 and the speed adjustment module 15 or does not supply power to the temperature measurement module 10 and the speed adjustment module 15 according to the determination result.

The temperature determination module 10 is further connected to the iBMC 1, to measure ambient temperature in the vicinity of the iBMC 1. The iBMC 1 is further connected to the speed adjustment module 15, to output corresponding pulse-width modulation (PWM) signals to the speed adjustment module 15 for controlling the fan 2. In the embodiment, the PSU 16 supplies a standby power signal P3V3_STBY.

Figure 2:
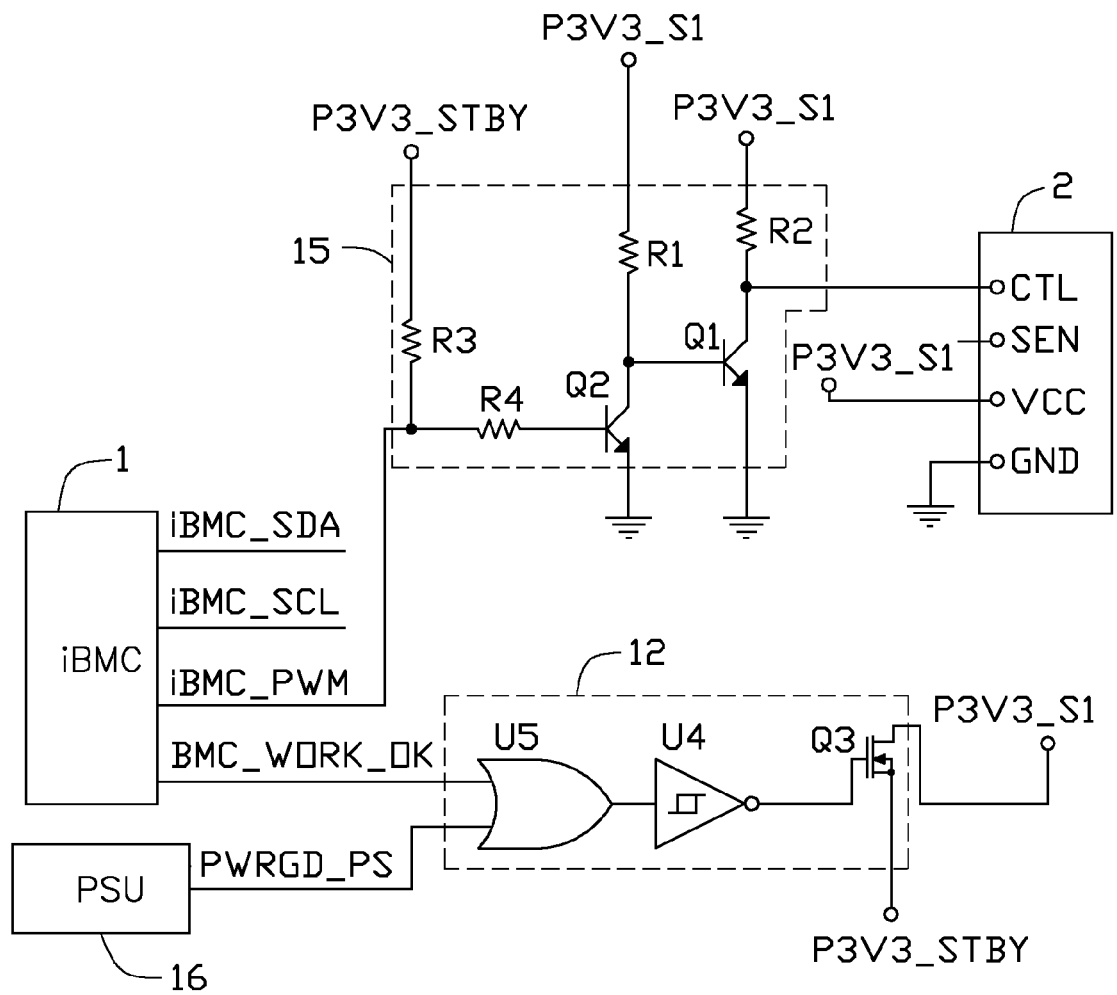
FIGS. 2-4 are circuit diagrams of the control circuit of FIG. 1.
Figure 3:
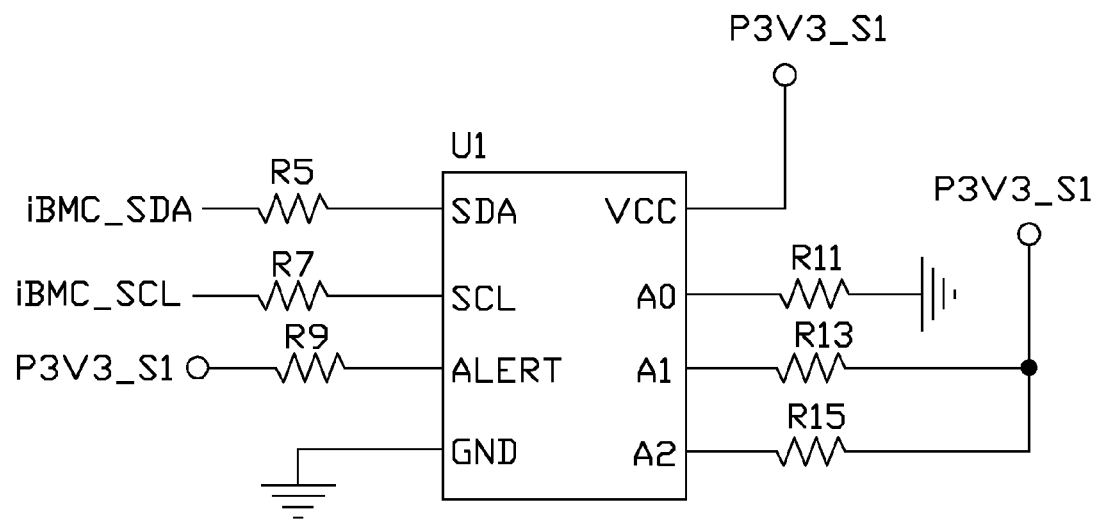
Figure 4:
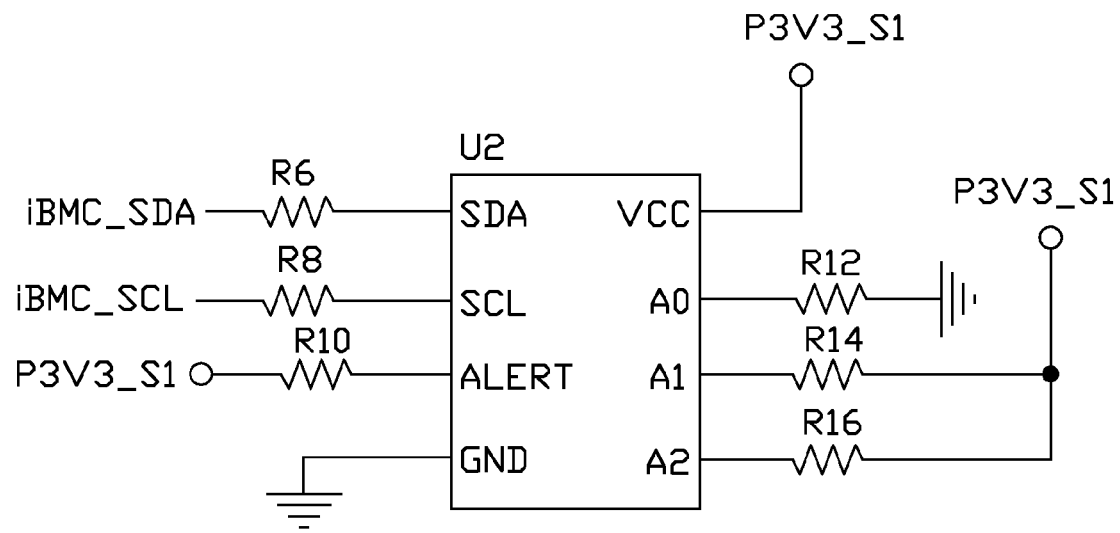

Referring to FIGS. 2-4, the state determination module 12 includes an OR gate U5, an inverter U4, and a metal oxide semiconductor field effect transistor (MOSFET) Q3. A first input terminal of the OR gate U5 is connected to the iBMC 1 for receiving a state signal BMC_WORK_OK from the iBMC 1. A second input terminal of the OR gate U5 is connected to the PSU 16 for receiving a state signal PWRGD_PS from the PSU 16. An output terminal of the OR gate U5 is connected to an input terminal of the inverter U4. An output terminal of the inverter U4 is connected to a gate of the MOSFET Q3. A source of the MOSFET Q3 is connected to the standby power signal P3V3_STBY. A drain of the MOSFET Q3 is to supply a power signal P3V3_S1 to the fan 2 and the temperature measurement module 10.

The temperature determination module 10 includes two temperature sensors U1 and U2. Data pins SDA of the temperature sensors U1 and U2 are connected to a data pin iBMC_SDA of the iBMC 1 through resistors R5 and R6 respectively. Clock pins SCL of the temperature sensors U1 and U2 are connected to a clock pin iBMC_SCL of the iBMC 1 through resistors R7 and R8 respectively. Power pins VCC of the temperature sensors U1 and U2 are connected to the drain of the MOSFET Q3 for receiving the power signal P3V3_S1. An alert pin ALERT of each of the temperature sensors U1 and U2 is connected to the drain of the MOSFET Q3 through resistors R9 and R10 respectively. An input/output (I/O) pin A0 of each of the temperature sensors U1 and U2 is grounded through resistors R11 and R12 respectively. An I/O pin A1 of each of the temperature sensors U1 and U2 is connected to the drain of the MOSFET Q3 through resistors R13 and R14 respectively. An I/O pin A2 of each of the temperature sensors U1 and U2 is connected to the drain of the MOSFET Q3 through resistors R15 and R16 respectively. Ground pins GND of the temperature sensors U1 and U2 are grounded.

The speed adjustment module 15 includes two bipolar junction transistors (BJTs) Q1 and Q2. A base of the BJT Q2 is connected to the standby power signal P3V3_STBY through resistors R4 and R3 in that order. A node between the resistors R4 and R3 is connected to a pulse-width modulation pin iBMC_PWM of the iBMC 1. An emitter of the BJT Q2 is grounded. A collector of the BJT Q2 is connected to the drain of the MOSFET Q3 through a resistor R1. The collector of the BJT Q2 is further connected to a base of the BJT Q1. An emitter of the BJT Q1 is grounded. A collector of the BJT Q1 is connected to the drain of the MOSFET Q3 through a resistor R2. The collector of the BJT Q2 is further connected to a control pin CTL of the fan 2. A power pin VCC of the fan 2 is connected to the drain of the MOSFET Q3 for receiving the power signal P3V3_S1. A ground pin GND of the fan 2 is grounded. A sense pin SEN of the fan 2 is idle.

When the server 100 is operating, the state signal PWRGD_PS from the PSU 16 is at a high level. When the server 100 is powered off, the state signal PWRGD_PS from the PSU 16 is at a low level. When the iBMC 1 is operating, the state signal BMC_WORK_OK from the iBMC 1 is at a low level. When the iBMC 1 is powered off, the state signal BMC_WORK_OK from the iBMC 1 is at a high level.

In the embodiment, the temperature sensors U1 and U2 are located near the iBMC 1 for measuring a temperature of the iBMC 1. Furthermore, the temperature sensors U1 and U2 have system management bus (SMBUS) interfaces.

When the server 100 is powered off and the iBMC 1 is operating, the state signal BMC_WORK_OK from the iBMC 1 is at a low level, and the state signal PWRGD_PS is at a low level. As a result, the input terminal of the inverter U4 receives a low level signal. The MOSFET Q3 is turned on. The standby power signal P3V3_STBY is transmitted to the temperature measurement module 10 and the fan 2 through the MOSFET Q3. The temperature measurement module 10 measures the temperature of the iBMC 1, and transmits the temperature of the iBMC 1 to the iBMC 1. The iBMC 1 outputs corresponding PWM signals according to the temperature, to the speed adjustment module 15. The speed adjustment module 15 controls the fan 2 according to the PWM signals.

When the server 100 and the iBMC are powered off, the state signal $BMC_{13}$ WORK_OK from the iBMC 1 is at a high level, and the state signal PWRGD_PS from the PSU 16 is at a low level. As a result, the input terminal of the inverter U4 receives a high level signal. The MOSFET Q3 is turned off. The fan 2 is not operating.

When the server 100 is operating, the state signal PWRGD_PS from the PSU 16 is at a high level. In this state, when the iBMC 1 is operating or powered off, the OR gate U5 outputs a high level signal. The MOSFET Q3 is turned off. The fan 2 is powered off. Under this circumstances, the server 100 is operating, and a system fan (not shown) of the server 100 is operating, so the iBMC 1 can be cooled by airflow from the system fan of the server 100. The fan 2 is powered off to save power.

In other embodiments, the speed adjustment module 15 and the temperature measurement module 10 can be omitted. In other words, the control circuit can activate or deactivate the fan 2, but cannot adjust the speed of the fan 2. In addition, the BJTs Q1 and Q2, and the MOSFET Q3 function as electronic switches.

The foregoing description of the exemplary embodiments of the disclosure has been presented only for the purposes of illustration and description and is not intended to be exhaustive or to limit the disclosure to the precise forms disclosed. Many modifications and variations are possible in light of disclosure above. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A control circuit set in a server, the control circuit controls a fan to cool an integrated baseboard management controller (iBMC) in the server, the control circuit comprising:
    a state determination module connected to the iBMC and a power supply unit (PSU) of the server, for determining states of the iBMC and the PSU;
    wherein when the server is powered off and the iBMC is operating, the state determination module receives a low level signal from the PSU and a low level signal from the iBMC, the state determination module connects the PSU and the fan, such that the fan is operating;
    when the server and the iBMC are powered off, the state determination module receives a low level signal from the PSU and a high level signal from the iBMC, the state determination module disconnects the PSU from the fan, such that the fan is powered off; and
    when the server is operating, the state determination module receives a high level signal from the PSU, the state determination module disconnects the PSU from the fan, such that the fan is powered off.

2. The control circuit of claim 1, wherein the state determination module includes an OR gate, an inverter, and a first electronic switch, two input terminals of the OR gate are respectively connected to the iBMC and the PSU, for respectively receiving state signals from the iBMC and the PSU, an output terminal of the OR gate is connected to an input terminal of the inverter, an output terminal of the inverter is connected to a control terminal of the first electronic switch, a first terminal of the first electronic switch is connected to the PSU, a second terminal of the first electronic switch is connected to a power pin of the fan.

3. The control circuit of claim 2, wherein the first electronic switch is a field effect transistor (MOSFET), a gate of the MOSFET is the control terminal of the first electronic switch, a source of the MOSFET is the first terminal of the first electronic switch, and a drain of the MOSFET is the second terminal of the first electronic switch.

4. The control circuit of claim 1, further comprising:
    a temperature measurement module connected to the iBMC and the state determination module, wherein when the server is powered off, and the iBMC is operating, the state determination module receives the low level signal from the PSU and the low level signal from the iBMC, the state determination module further connects the fan and the temperature measurement module, the temperature measurement module measures a temperature of the iBMC, the iBMC outputs corresponding pulse-width modulation (PWM) signals according to the temperature; and
    a speed adjustment module connected to the iBMC and the fan, for adjusting the fan according to the PWM signals from the iBMC.

5. The control circuit of claim 4, wherein the temperature measurement module comprises at least one temperature sensor, a data pin of the temperature sensor is connected to a data pin of the iBMC through a first resistor, a clock pin of the temperature sensor is connected to a clock pin of the iBMC through a second resistor, a power pin of the temperature sensor is connected to the state determination module, an alert pin of the temperature sensor is connected to the state determination module through a third resistor, first to third input/output pins of the temperature sensor are connected to the state determination module through fourth to sixth resistors respectively, a ground pin of the temperature sensor is grounded.

6. The control circuit of claim 4, wherein the speed adjustment module comprises:
    a second electronic switch comprising a control terminal connected to a pulse-width modulation pin of the iBMC, a first terminal grounded, and a second terminal connected to the state determination module through a seventh resistor; and
    a third electronic switch comprising a control terminal connected to the second terminal of the second electronic switch, a first terminal grounded, and a second terminal connected to the state determination module through an eighth resistor, and connected to a control pin of the fan.

7. The control circuit of claim 6, wherein the second electronic switch is a bipolar junction transistor (BJT), a base of the BJT is the control terminal of the second electronic switch, a collector of the BJT is the second terminal of the second electronic switch, and an emitter of the BJT is the first terminal of the second electronic switch.

8. The control circuit of claim 6, wherein the third electronic switch is a bipolar junction transistor (BJT), a base of the BJT is the control terminal of the third electronic switch, a collector of the BJT is the second terminal of the third electronic switch, and an emitter of the BJT is the first terminal of the third electronic switch.

* * * * *